United States Patent
Grootjans et al.

(10) Patent No.: US 10,955,679 B2
(45) Date of Patent: Mar. 23, 2021

(54) SYSTEM COMPRISING GLASSES AND A COMMUNICATION UNIT

(71) Applicant: Iristick NV, Sint-Martens-Latem (BE)

(72) Inventors: Riemer Grootjans, Antwerp (BE); Jasper Van Bourgognie, Antwerp (BE); Vianney Le Clément de Saint-Marcq, Brussels (BE); Peter Verstraeten, Sint-Martens-Latem (BE)

(73) Assignee: Iristick NV, Sint-Materns-Latem (BE)

( * ) Notice: Subject to any disclaimer, the term of this patent is extended or adjusted under 35 U.S.C. 154(b) by 0 days.

(21) Appl. No.: 16/490,633

(22) PCT Filed: Mar. 5, 2018

(86) PCT No.: PCT/EP2018/055381
§ 371 (c)(1),
(2) Date: Sep. 3, 2019

(87) PCT Pub. No.: WO2018/172051
PCT Pub. Date: Sep. 27, 2018

(65) Prior Publication Data
US 2020/0004027 A1    Jan. 2, 2020

(30) Foreign Application Priority Data
Mar. 3, 2017  (EP) .................................... 17159038

(51) Int. Cl.
*G09G 1/08*  (2006.01)
*G09G 5/00*  (2006.01)
(Continued)

(52) U.S. Cl.
CPC ..... *G02B 27/0176* (2013.01); *G02B 27/0101* (2013.01); *G02B 27/0172* (2013.01); *G02B 2027/0178* (2013.01); *H04N 13/344* (2018.05)

(58) Field of Classification Search
CPC ................................. G06N 20/00; G06N 3/02
See application file for complete search history.

(56) References Cited

U.S. PATENT DOCUMENTS

2003/0033417 A1* 2/2003 Zou ........................... G06F 3/14
                                                                709/230
2015/0185483 A1 7/2015 Hiraide
(Continued)

FOREIGN PATENT DOCUMENTS

GB    2497566 A *  6/2013    ......... H04L 25/4902
GB    2497566 A     6/2013
(Continued)

OTHER PUBLICATIONS

Anonymous: "Google Glass—Wikipedia", Jul. 16, 2013, Retrieved from the Internet.

*Primary Examiner* — Nan-Ying Yang
(74) *Attorney, Agent, or Firm* — James Creighton Wray

(57) ABSTRACT

The present invention relates to a system comprising glasses (101), a communication unit (103) and a cable (102), whereby the cable comprises two galvanic connections adapted for transporting power and bidirectional data traffic, whereby the glasses and the communication unit are arranged for multiplexing a plurality of outgoing data streams into a multiplexed data stream to be transmitted over said cable and arranged for receiving an incoming data stream and demultiplexing said incoming data stream into separate data streams, and whereby said communication unit (103) is arranged for being connected wired or wirelessly to an external processing device (201), preferably the external processing device being a smartphone.

15 Claims, 3 Drawing Sheets

(51) Int. Cl.
  *G02B 27/01*   (2006.01)
  *H04N 13/344*   (2018.01)

(56) References Cited

U.S. PATENT DOCUMENTS

| | | |
|---|---|---|
| 2015/0186728 A1 | 7/2015 | Kimura |
| 2015/0216762 A1* | 8/2015 | Oohashi ............ A61H 23/0236 |
| | | 601/47 |
| 2015/0295735 A1 | 10/2015 | Gardner |
| 2016/0093108 A1* | 3/2016 | Mao ........................ A63F 13/30 |
| | | 345/633 |

FOREIGN PATENT DOCUMENTS

| | | |
|---|---|---|
| WO | 2012117886 A1 | 9/2012 |
| WO | 2013052886 A2 | 4/2013 |
| WO | 2013085854 A1 | 6/2013 |

* cited by examiner

SYSTEM COMPRISING GLASSES AND A COMMUNICATION UNIT

This application claims the benefit of European Application No. 17159038.3 filed Mar. 3, 2017 and PCT/EP2018/055381 filed Mar. 5, 2018, International Publication No. WO 2018/172051 A1, which are hereby incorporated by reference in their entirety as if fully set forth herein.

FIELD OF THE INVENTION

The present invention is generally related to the field of electronic equipment and, more particularly, to a system comprising a headset and a communication unit linked with each other.

BACKGROUND OF THE INVENTION

An electronic system as illustrated in FIG. 1 is considered. The electronic system comprises a modular headset (101) and a modular communication unit (103), connected together via a link (102). The link can be used to provide communication between both devices and/or share power between them. It can be a wireless or wired connection.

The link (102) connects the headset to the communication unit and can transfer power and data in either direction. Typically power is transferred from the communication unit towards the headset. Data traffic is typically bidirectional and in at least one direction high-speed (i.e. multi-Megabit/s or even multi-Gigabit/s).

The modular communication unit (103) controls the communication at the other end of the link. It can process the data sent to or received from the link. It can act as a bridge to other communication devices or networks, as an example it can send raw or processed data retrieved from the headset to other devices over a network, or receive data from the network and use this, either to forward to the headset or for processing of its own data.

Various such electronic systems have been proposed in the art. Reference is made for example to patent applications US2015/185483 and WO2013/85854. These prior art mechanisms rely on one or more thick, and therefore heavy, cables connecting the headset to the processing unit. Some of the proposed systems embed multiple cables (one for power and one for data, for example) into one cable assembly, but the result remains thick and sturdy.

Some of the proposed systems implement electronics on both the left and right side of the headset, sometimes resulting in cables coming out of both sides of the headset. Other systems, such as disclosed in US2015/186728, combine a multitude of cables into one thick main cable at a convergence point.

Some system designers have noticed this thick cable can be very annoying for the operator, for example when moving the head. As a solution they propose, e.g. in WO2012/117886 A1, to fold the cable into a curled spiral, which obviously increases the weight of the cable even more.

Some systems propose an exit for the cable next to the eye of the operator, while it is more comfortable to have the cable exit the headset behind the ear; at the end of the ear leg.

Hence, there is a need for a system comprising a headset and a communication unit which are linked with a cable capable of transferring power and high-speed data, wherein the above-mentioned problems encountered in the prior art solutions are avoided or overcome.

SUMMARY OF THE INVENTION

It is an object of embodiments of the present invention to provide for a system comprising a headset and a communication unit linked with each other in a comfortable way and suitable for power and high-speed data transfer.

The above objective is accomplished by the solution according to the present invention.

In a first aspect the invention relates to a system comprising a headset and a communication unit arranged for communicating with each other via a link, whereby said link is a cable with two galvanic connections adapted for transporting power and bidirectional data traffic and wherein said headset and said communication unit are arranged for multiplexing a plurality of outgoing data streams in the time domain into a multiplexed data stream to be transmitted over the link and arranged for receiving an incoming data stream and demultiplexing the incoming data stream into separate data streams.

The proposed solution indeed allows for connecting the headset with the communication unit via a cable which can be physically thinner and lighter compared to typical cables containing more than two galvanic connections. Despite the presence of only two galvanic connections the various streams of power and data traffic can be combined by the multiplexing means and transmitted over the physically thin link as a single bit stream. The device at the other side of the link can decompose the single bit stream into separate streams again.

In a preferred embodiment the headset and the communication unit are arranged for performing DC balancing on the multiplexed data stream.

Advantageously, the headset and the communication unit each comprise a high-pass filter for coupling the multiplexed data stream.

Preferably the system comprises low-pass filtering means for superimposing on the link a DC voltage signal.

In a preferred embodiment the link is a coaxial cable or a twisted pair cable.

In an embodiment the system comprises a silicone, PVC or PU based layer around the coaxial cable or the twisted pair cable.

In another embodiment the headset and said communication unit each comprise a data controller arranged for controlling the incoming and outgoing data.

In another embodiment the headset comprises a connector for connecting said link. The connector is preferably also adapted for connecting an electronic circuit in the headset.

In one embodiment at least one of the headset and the communication unit comprises a plurality of data generators.

Advantageously, at least one of said headset and said communication unit is arranged for detecting data corruption.

In a preferred embodiment control data packets can be added to the multiplexed data stream.

In another embodiment the communication unit is arranged for being connected wired or wirelessly to an external processing device.

In one embodiment the communication unit comprises data buffering means.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

DETAILED DESCRIPTION OF ILLUSTRATIVE EMBODIMENTS

Figure 1:
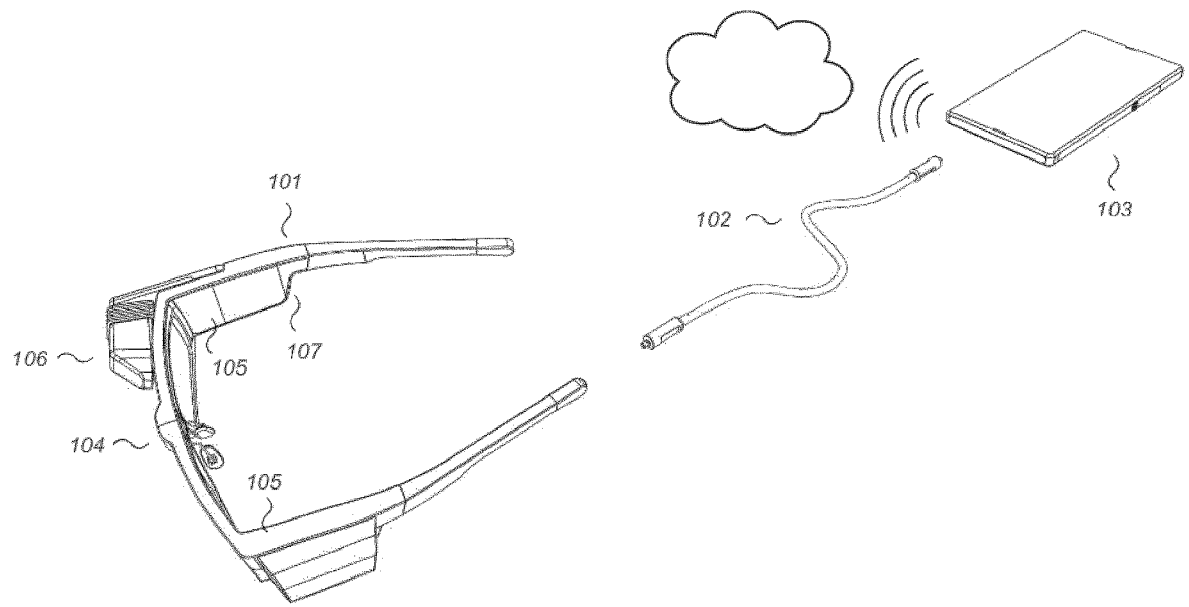
FIG. 1 illustrates an electronical system comprised of a modular headset connected through a physical link to a communication device which can be connected to a network.

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The present invention proposes an electronic system comprising a modular headset (101), connected with a link (102) to a modular communication device (103). This communication device can be connected either directly (202) to a network (203) or to a further processing device (such as a smartphone) which can be connected (204) to the same network (203) or to another network (205).

The modular headset can contain multiple subsystems, some of which perform system-critical tasks such as the power management part and controller. Other subsystems gather sensory information and/or output feedback to the operator. Sensory information gathered by the headset can include environmental information such as temperature, humidity and ambient light level, but also images acquired by one or more digital image sensors (104) and audio captured by one or more microphones (105) (see FIG. 1). Feedback output by the headset can include images displayed in one or more displays or micro-displays (106) integrated in the headset and audio signals produced by one or more speakers (107) integrated in the headset.

Figure 2:
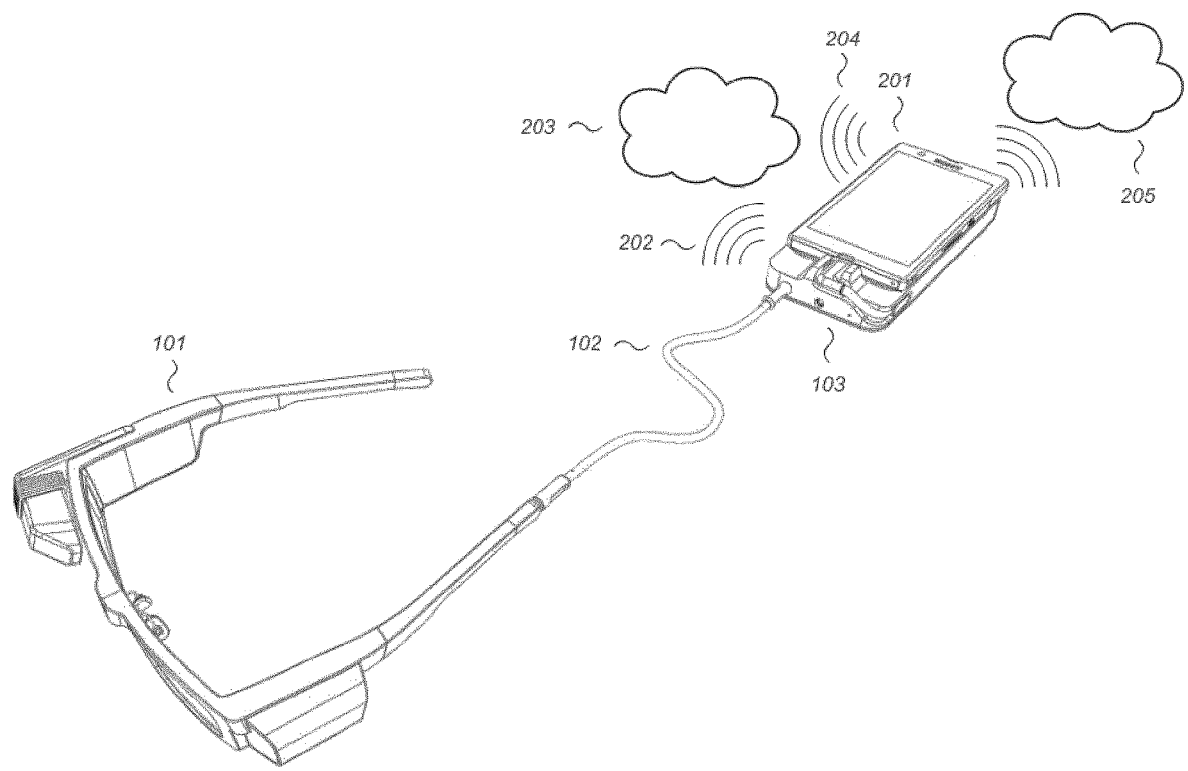
FIG. 2 illustrates the connection of the communication device (103) of the system to a further processing device (201), which can be connected to the same or a different network.

The modular communication unit (103) can be connected to a further device (201), such as a mobile phone as shown in FIG. 2. In such case, the communication device controls the communication over the link (102). It can process the data sent to or received from the link. It can also buffer the data from the headset to the further device and buffer the data from the further device to the headset. The further device can subsequently process any data coming from or sent to the communications device.

The link between headset and communication device is preferably physically thin and flexible and yet allows for power and/or bidirectional high-speed data communication traffic. High-speed thereby means multi-megabits/s or even multi-gigabits/s. To achieve this it is proposed to use a cable with only two galvanic connections, such as a coaxial cable or a single twisted-pair cable with jacket, to connect the headset to the communication unit. In order to be able to transmit bidirectional data between headset and communication device, the headset implements a data manipulation device (301), such as FPGA, ASIC or processor, which multiplexes (303) balances DC (304) data streams (302), preferably all active data streams, from the headset to communication device in the time domain into one bit stream. See FIG. 3. Additionally, the communication device implements a similar data manipulation device (305), such as FPGA, ASIC or processor, which multiplexes (306) balances DC (308) data streams, preferably all active data streams, from the communication unit to the headset in the time domain into a bit stream. These continuous bit streams of the headset device and communication device are sent to a transceiver (309,310), which transmits the data over the link (102) with the two galvanic connections, and receives the data from the other side. This way, the headset and the communication unit can send data to and receive data from each other over a single cable with two galvanic connections, such as a coaxial cable or single twisted-pair cable with jacket.

Before sending the bit stream to the transceiver, the streams can be DC-balanced which makes it easier for the receiving transceiver to correctly receive the bit stream. This makes it possible to increase the link length or to reduce the power of the transceivers.

By AC-coupling this data to the two-wire link through a high-pass filter such as a capacitor (311,312), a DC voltage can be superimposed on the cable through a low-pass filter, such as an inductor or ferrite bead (313,314). This allows the communication unit to provide power to the headset over the thin cable (102), while the cable is used at the same time for the high-speed bidirectional communication. Since data and power are separated from each other through low-pass and high-pass filters, a high voltage can be used as DC voltage, resulting in a low required current to be sent over the cable, which is beneficial, as a lower current yields a lower power loss over the cable.

The impedance of the cables used and of the connectors between both transceivers must be well-controlled. Typical impedance values are 50 ohm or 75 ohm. Thin versions of these impedance controlled coax cables are commercially available, with total outer diameters down to 0.87 mm or even lower commercially available.

Coax cable and twisted-pair cables are known to be rigid. In order to reduce the rigidity, the thin coax cable or twisted-pair (401) can be surrounded with a silicone-based layer (402), making the cable more flexible. In order to increase the robustness of such thin cable, an overmould (403) potentially including strain relief can be added to make sure the cable is not easily separated from its connector when pulled.

To increase the cable robustness, a strengthening component (such as a Kevlar wire) can be included inside the assembly, where the strengthening component is connected to connectors on both ends. When pulled, all force is then absorbed by that strengthening component. It has to be noted that in case a conductive component is used as strengthening component, this would result in a third galvanic connection. However, since no data is sent over this third connection, the data and power are still sent over only two galvanic connections.

Using such a thin coax cable or single twisted pair has the benefit that a low-pin count connector can be used. Preferably a small 2-pin connector is used, such as a MMCX connector. A thin cable allows integrating part of the cable in the temple of the glasses or even in the bridge across the nose of the operator. This allows positioning the connection between the cable and the electronics inside the headset virtually anywhere.

Any suitable coaxial connector can be used to connect the cable to the electronics inside the headset, such as a micro-miniature coaxial (MMCX) connector or smaller, or other RF connectors for high-frequency signals like an U.LF or IPEX connector (502). Such a small connector is in headsets also preferable over a traditional connector with larger pin counts which require a larger PCB estate.

Typically the cable connects to electronics near the temple of the operator and then runs through the ear leg to the end of the ear leg, where it exits the headset. When running a cable through the ear leg it is very beneficial for the cable to be thin and flexible, as this allows implementing an ear leg which is bendable to provide an optimized fit for the operator.

The cable can simply exit the headset or a suitable connector (such as MMCX) can be placed at the exit (501). This allows detaching the cable from the headset. A short cable (503) inside the headset then connects this connector to the electronics inside the headset.

Because of the simplicity of a cable with only two galvanic connections, only one bit can be sent at a time in each direction.

The headset (101) can have many data generators, such as image sensor, microphones, ambient sensors, gesture sensors. The generated data streams need to be combined into a single bit stream towards the communication unit, in such a way that it can be decomposed by the communication unit, preferably without loss of data and with data corruption detection. The multiplexed data stream must be complemented with non-continuous data packets which need to be sent from headset to communication device, such as status updates originating from controllers or other components inside the headset, and system messages such as I2C or SPI commands and their responses.

The communication unit (103) can also have many data generators, such as image streams which need to be sent to display modules on the headset, audio streams which need to reach the speakers in the headset and more. Additionally the communication unit can be connected to a further processing device (such as a smartphone), from which it can receive data streams which need to be forwarded to the headset as well. All of these data streams need to be combined into a single bit stream, in such a way that it can be decomposed by the headset, preferably without loss of data and with data corruption detection. This needs to be complemented with non-continuous data packets which need to be sent from communication device to headset, such as system messages and I2C or SPI commands and responses.

The data multiplexing is described next for the 'sending' device and the 'receiving' device. Since the system is bidirectional, this can either be 'headset and communication device' or 'communication device and headset', respectively.

The sending device has only one communication channel to the receiving device available. Each outgoing stream is given an ID and a frame size is defined for each stream in number of bytes. For each stream which needs to be sent, the sending device implements a buffer which can collect the data until it contains sufficient data for one frame. Whenever the communication channel is occupied by a frame of another stream, the buffers allow the data manipulation device of the sending side to still receive data from each of its data generators. Additionally, said buffers allow merging data from continuous sources (e.g. imagers, microphones) with data coming from non-continuous sources (e.g. status update, I2C responses). Finally, the buffers allow data sources to start or stop generating data without notifying the data manipulation device. Indeed, if a generator has stopped generating data, it does not fill up its buffer and no data is sent to the receiving side. Whenever the data generators start again, its generated data is sent to the receiving side as soon as its buffer contains enough data for one frame.

Whenever a frame has been transmitted, the data manipulation device checks whether one of its outgoing buffers contains sufficient data to transmit a frame and selects this as next frame to transmit over the link. By assigning priorities to the data streams, certain data streams can be prioritized by making sure they are selected in case multiple buffers contain a valid frame.

Whenever a frame is transmitted over the cable, it is accompanied by its stream ID. This allows the receiving side to know how many bits are coming in this frame. The receiving side also has a buffer for each incoming stream, and uses said ID of the stream to store the incoming data into the correct buffer.

The receiving side can keep track of available space in its buffers and communicate this information as an additional stream with high priority to the sending device. As such, the sending device knows when to throttle communication on a stream, during which it can transfer data from other streams. Due to this, it is also possible that the buffers on the headset are filled up; in which case the system must make sure that generated data is discarded in a graceful manner (so it does not lead to system lockups).

Both the headset and the communication device are in a preferred embodiment able to detect if data corruption or loss has occurred, so that the corrupted data can be discarded. In case of a significant data corruption (such as an electrostatic discharge (ESD) impact) which lasts for a longer time leading to significant data loss, the system is preferably able to detect this and restart its communication. This should happen fast enough (preferably in less than 100 ms) so that the performance impact for the operator remains acceptable. Data corruption can be detected at various levels. In case DC-balancing was applied and a received bit stream is no longer DC balanced, this indicates at least one bit has become corrupted. Also, at any point a checksum can be inserted into the bit stream, allowing the receiving side to perform a CRC check. Variations of this technical implementation also allow providing data correction techniques in case data corruption has occurred. Finally, in severe cases of data corruption the transceiver will signal it is no longer able to lock onto the received data.

Figure 3:
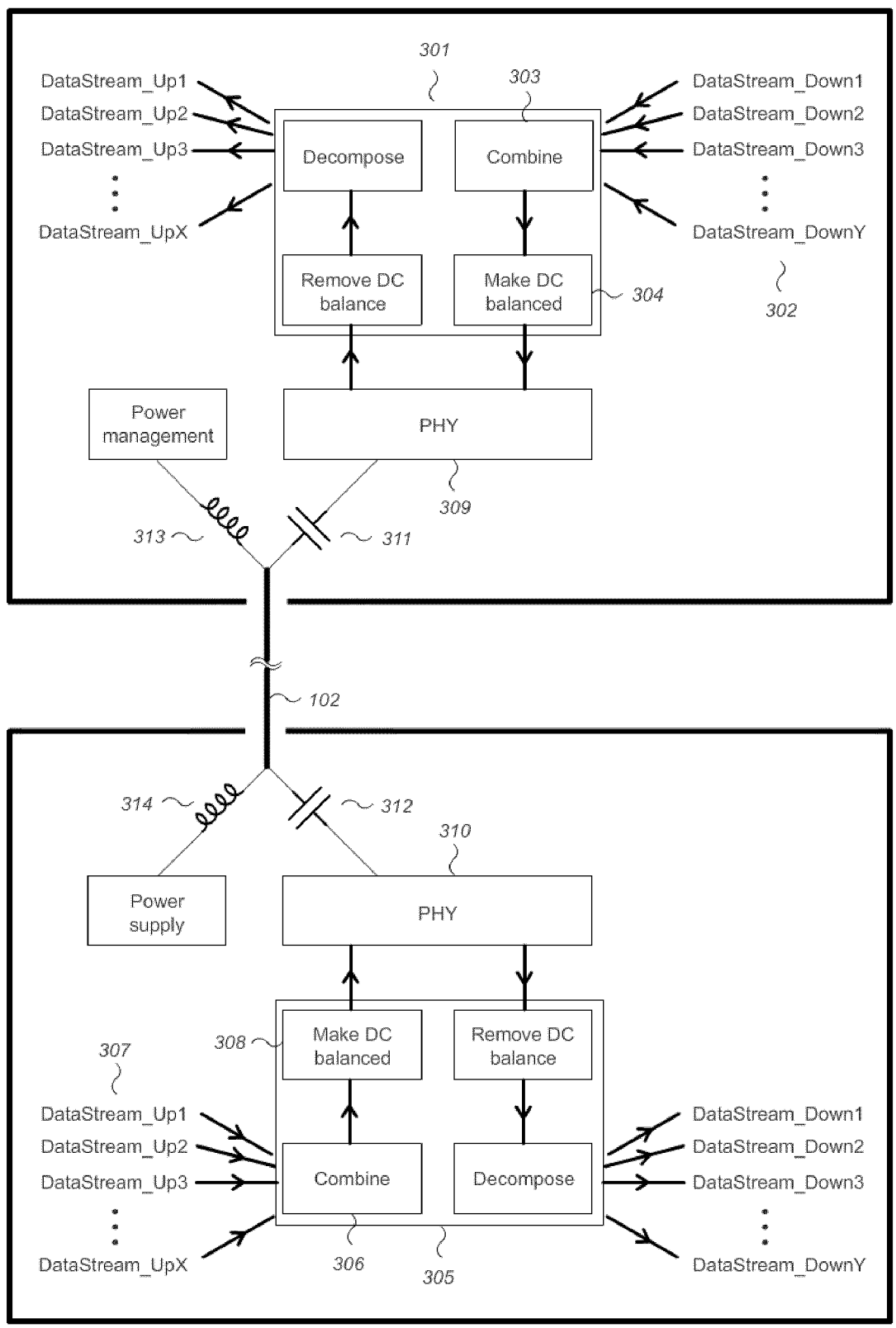
FIG. 3 illustrates a block diagram of the proposed system, allowing power and bidirectional high-speed data to be sent over a single link comprising two galvanic connections (102).
Figure 4:
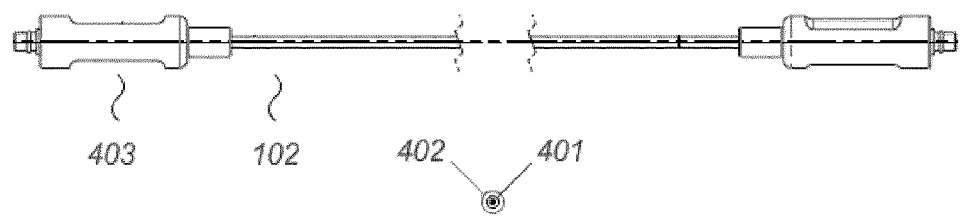
FIG. 4 illustrates a cable comprising two galvanic connections with an overmould around a two-pin connector on both sides of the cable; as well as a cross-section of said cable.
Figure 5:
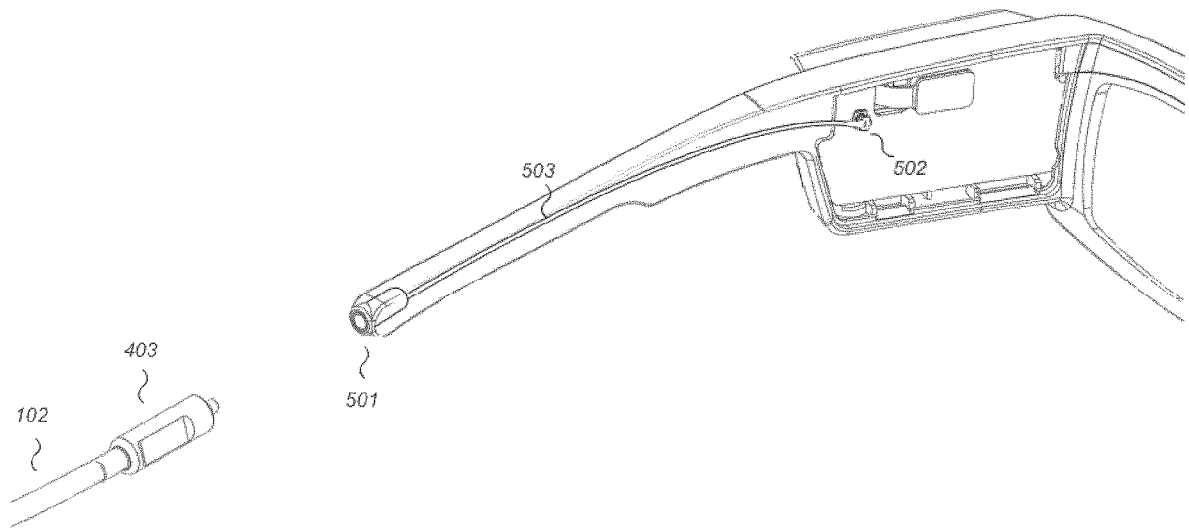
FIG. 5 illustrates an implementation of a cable with two galvanic connections connected to the electronics embedded into the headset. An additional connector is positioned at the end of the ear leg, to make the cable disconnectable from the headset. This results in a shorter cable containing two galvanic connections running from the external connector to the connector on the PCB.

As shown in FIG. 3, power is transferred to and from the link over a low-pass filter (313, 314). The high-speed bidirectional data is transferred to and from the link over a high-pass filter (311, 314). Manufacturers offer equalizer solutions (309, 310) such as Microchip's EQCO850SC which take care of the physical layer of the data connection after the high-pass filter.

The equalizers only provide a physical layer of the data connection, providing on each side one channel for data in each direction. Therefore, the present invention proposes to include at each side a data manipulation device (301, 305) which effectively merges separate continuous and non-continuous data streams which need to be sent over the link into one continuous data stream, with or without applying DC balancing first. This data stream can contain sensory data, commands and status updates. Additionally, each side includes a data manipulation device, which consumes the data stream generated by the other side and decomposes it into the separate data streams again.

The communication unit (103) can either be connected to a further processing device (201), such as a smartphone, tablet or laptop. See FIG. 2. In such case, the communication unit (103) can provide a buffer for the data from headset to the processing device or for the data coming from the processing device to the headset. This can be needed to provide a seamless interface to the smartphone. The connection between the communication unit and processing device can be wireless or wired. For wireless communication any wireless communication protocol can be used, such as Wifi for which a Wifi controller, a physical converter and antenna must be implemented in both devices, or such as Bluetooth for which a Bluetooth controller, a physical converter and antenna must be implemented in both devices.

For wired communication any protocol supported by the processing device can be used, such as for example USB. In this case the communication unit includes a USB controller, physical converter and connector, such as miniB, microB or TypeC, and should be connected to the USB port of the processing device over a typical or custom USB cable.

If desired, an audio cable with suitable connector can be used to make an audio connection between communication unit and processing device. This can be desirable in case the processing device does not provide sufficient audio capabilities over the main wired or wireless connection.

On the processing device (201) software is running which can interface to and control the combination of communication unit and headset. This allows creating software programs which have full control over the combination and have access to all data going over the link.

Both the communication unit and/or the processing device can be connected to a network (203, 205). This connection can be either over typical wireless protocols, such as Wifi or Bluetooth, or over a wired connection such as a LAN. This network connection allows designated devices on the network to have full control over the combination of communication unit and headset and have access to and manipulate data transmitted over the link.

The network connection furthermore allows software programs running on the communications device or processing device to send their data to other machines on the network, or to receive data from or fetch data from other machines on the network.

The headset or communication unit can embed one or more processors for processing the data passing over the link in either direction. As an example a processor can be embedded to improve the image data generated from an image sensor in the headset. A processor can be contained which processes the audio captured by the microphones in the headset to improve its quality and/or to detect certain words or phrases; a processor can be embedded which compresses or decompresses data before or after it is sent over the link, to/from the processing device or to/from the network. Additionally, a processor can be embedded which adds or modifies headers in the data streams, for example to provide the glue logic between data from the communication device and headset, for example converting the audio streams from the headset to UAC (USB Audio Class) data allowing it to feed in into the processing device, which might be a smartphone with built-in support for UAC data streams.

Making a bit stream DC balanced and converting back to the original stream can be obtained using well-known mechanisms such as 8b10b. This, together with the multiplexing and de-multiplexing of the various bit streams can be implemented in either headset or communication device using a single chip such as FPGA, ASIC or CPU, or each task can be performed in a separate chip such as FPGA, ASIC or CPU.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

In a preferred embodiment, the headset are glasses (101) comprising one or more digital image sensors (104). In this case, the system comprises glasses (101), a communication unit (103) and a cable (102), whereby the glasses (101) comprise one or more digital image sensors (104), whereby the cable comprises two galvanic connections adapted for transporting power and bidirectional data traffic, whereby said glasses and said communication unit are arranged for multiplexing a plurality of outgoing data streams, preferably a plurality of outgoing data streams in the time domain, into a multiplexed data stream to be transmitted over said cable and arranged for receiving an incoming data stream and demultiplexing said incoming data stream into separate data streams. Preferably, the communication unit (103) is arranged for being connected wired or wirelessly to an external processing device (201). Preferably, the external processing device is a smartphone. The system is thereby capable to connect multiple sensors and/or actuators on the glasses with different clock domains to multiple sensors and/or actuators on the connection unit and/or external processing device with different clock domains.

In a preferred embodiment, the glasses comprise an ear leg, whereby the ear leg comprises an end, and whereby further the end comprises a connector (501) for detachably connecting the cable (102). Preferably, the connector is a micro-miniature coaxial connector. Preferably, the glasses comprise two ear legs, whereby at most one ear leg comprises an end comprising a connector (501). Preferably, the system is configured for power transport and bidirectional data traffic between the glasses and the communication unit via at most one cable (102).

In a preferred embodiment, the communication unit (103) comprises a rechargeable battery for providing power to the glasses. Preferably, the rechargeable battery is adapted for charging at various speeds depending on the external power source.

In a preferred embodiment, the communication unit (103) comprises a rechargeable battery and a means for wired connection with the further processing device, whereby the communication unit (103) is configured for providing power to the glasses, and whereby the communication unit (103) is further configured for providing power to and/or charging the external processing device (201). The means for wired connection may comprise a USB connector or Lightning connector. The external processing device may comprise instructions for controlling the glasses. The communication unit (103) serves in this case as a bridge connection between the external processing device (201) and the glasses (101), as well as a power bank. Use of an external processing device is advantageous as it provides a standardized development environment (e.g. Android), as well as an economically beneficial solution to provide sufficient processing power, as the processing power of a smartphone remains often idle, especially when a user is working.

In a preferred embodiment, the communication unit (103) is configured to provide power from the external processing device (201) to the glasses in case the rechargeable battery of the communication unit cannot provide sufficient power, for example, when the rechargeable battery is empty.

In a preferred embodiment, the communication unit (103) is configured for detecting a shortcut in the cable (102).

In a preferred embodiment, the communication unit (103) is configured for monitoring voltages and power consumption by the glasses and/or the external processing device. Preferably, the communication unit (103) is configured to decouple the rechargeable battery in case too much current is drawn from the battery and/or in case a current spike exceeds a predefined threshold.

In a preferred embodiment, the communication unit (103) comprises one or more sensors, preferably the one or more sensors comprising one or more environmental sensors (e.g. a temperature sensor) and/or an internal temperature sensor. The communication unit (103) can thereby be configured to prevent overheating based on a measured signal of the internal temperature sensor and a predefined temperature threshold.

In a preferred embodiment, the communication unit comprises an accelerometer. Preferably, the communication unit is configured to be activated via movement, e.g. by shaking.

In a preferred embodiment, the communication unit comprises multiple indicators. An indicator may be a status light emitting diode (LED). The communication unit may be configured to indicate via one or more indicators whether the external processing device and/or the glasses are connected or disconnected. The communication unit may be configured to indicate via one or more indicators the status of the rechargeable battery and/or a charging status of the rechargeable battery.

In a preferred embodiment, the glasses are safety glasses. Preferably, the glasses are compliant with EN166, a European Standard for Eye Protection. The glasses comprise two lenses. Each lens may be UV-protective. Each lens may be IR protective. Each lens may be able to withstand impacts against small objects travelling up to 45 meters per second, preferably 120 meters per second, more preferably 190 meters per second (EN166).

In a preferred embodiment, the glasses comprise a barcode submodule. The barcode submodule comprises a zoom lens, a flash LED and a laser pointer for barcode scanning. The zoom lens is preferably a liquid zoom lens. The barcode submodule may further comprise a collimator associated with the flash LED to focus all the light on the barcode. The laser pointer may be used to indicate the barcode at longer distances. Preferably, the glasses furthermore comprise an accelerometer. The accelerometer allows to detect when a user maintains the glasses in essence in the same position, preferably over a predetermined time period. In this embodiment, the glasses may comprise two cameras: a first camera (digital image sensor) for regular images and/or movies as well as a second camera for barcode scanning. The second camera is preferably an RGB imager, which has to be contrasted with grayscale images as typically used for barcode scanning. This has the advantage that the second camera can be further used for zoomed-in images during use cases for remote assistance, e.g. over Skype via the further processing device. In this embodiment, the glasses may comprise a barcode scanning mode wherein the laser pointer emits light and wherein the system detects via the accelerometer when a user holds the glasses in essence the same position for at least one second, whereupon the flash LED is used to illuminate the barcode, which is then captured via the second camera.

In another preferred embodiment, both the glasses and the communication unit are configured for data recovery on the lowest layer. This data recovery can be implemented on each datastream of FIG. 3, consisting of a transmitter and receiver. Each package transmitted in such datastream is provided with a sequence number and CRC code by the transmitter. This allows the receiver to detect whether the next package of the datastream has been received in good condition, after which an ACK message is sent to the transmitter. In case an error was detected by the transmitter, the transmitter sends a NACK message to the transmitter. Only after receiving an ACK message, the transmitter is allowed to send the next package of the datastream. In case an ACK message is not received after a predefined amount of time, or in case a NACK message is received by the transmitter, the transmitter resends the package.

In order to prevent stalls while waiting for ACK messages, the transmitter can opt to already send a predefined number of additional packets. In case an ACK message for package X is not received after a predefined amount of time, or in case a NACK message is for package X received by the transmitter, the transmitter resends all packets starting from packet X.

The invention claimed is:

1. System comprising a headset (101), a communication unit (103) and a cable (102), whereby the cable comprises two galvanic connections adapted for transporting power and bidirectional data traffic, whereby said headset and said communication unit are arranged for multiplexing a plurality of outgoing data streams into a multiplexed data stream to be transmitted over said cable and arranged for receiving an incoming data stream and demultiplexing said incoming data stream into separate data streams, whereby the headset and/or the communication unit comprise an image data generator, and whereby said communication unit (103) is arranged for being connected wired or wirelessly to an external processing device (201), wherein the headset and the communication unit each comprise a data buffering means, and wherein the communication unit (103) comprises a rechargeable battery for providing power to the headset via the two galvanic connections, and wherein the headset and the communication unit each comprise a data manipulation device (301, 305) for merging separate continuous and non-continuous data streams to be sent over said cable, and a data manipulation device for decomposing the received merged data streams into the separate data streams again, and whereby the headset and the communication unit each comprise a high-pass filter and an equalizer for providing a physical layer for simultaneous bidirectional data transfer over one physical channel, wherein said headset comprises one or more displays or micro-displays integrated in the headset.

2. System as in claim 1, wherein said headset comprises glasses.

3. System as in claim 1, wherein said headset and said communication unit are arranged for performing DC balancing on said multiplexed data stream.

4. System as in claim 1, wherein said headset and said communication unit each comprise a high-pass filter (311, 312) for coupling said multiplexed data stream, and whereby the system further comprises low-pass filtering means (313, 314) for superimposing on said cable a DC voltage signal.

5. System as in claim 1, wherein said cable is a coaxial cable or a twisted pair cable.

6. System as in claim 1, wherein said headset and said communication unit each comprise a data controller (301, 305) arranged for controlling said incoming and outgoing data.

7. System as in claim 1, wherein said headset comprises a connector for connecting said headset.

8. System as in claim 7, wherein said connector is also adapted for connecting an electronic circuit in said headset.

9. System according to claim 7, wherein the headset comprise an ear leg, whereby the ear leg comprises an end, whereby the end comprises the connector (501) for detachably connecting the cable.

10. System according to claim 1, whereby the ear leg comprises an end, whereby the cable exits the headset via the end of the ear leg.

11. System as in claim 1, wherein at least one of said headset and said communication unit comprises a plurality of data generators.

12. System as in claim 1, wherein at least one of said headset and said communication unit is arranged for detecting data corruption.

13. System as in claim 1, wherein control data packets can be added to said multiplexed data stream.

14. System according to claim 1, wherein the communication unit (103) comprises a means for wired connection with the further processing device, whereby the communication unit (103) is configured for powering the headset, and whereby the communication unit (103) is further configured for powering and/or charging the external processing device (201).

15. System according to claim 1, wherein the headset comprise a barcode submodule comprising a zoom lens, a flash LED and a laser pointer for barcode scanning, headset the glasses further comprising an accelerometer.

* * * * *